(12) United States Patent
Nam et al.

(10) Patent No.: US 9,577,175 B1
(45) Date of Patent: Feb. 21, 2017

(54) EFFICIENT POLARIZATION INDEPENDENT SINGLE PHOTON DETECTOR

(71) Applicant: NATIONAL INSTITUTE OF STANDARDS AND TECHNOLOGY, Gaithersburg, MD (US)

(72) Inventors: Sae Woo Nam, Boulder, CO (US); Burm Baek, Lafayette, CO (US); Francesco Marsili, Pasadena, CA (US); Varun Verma, Boulder, CO (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 304 days.

(21) Appl. No.: 14/698,442

(22) Filed: Apr. 28, 2015

Related U.S. Application Data (63) Continuation of application No. 13/869,802, filed on Apr. 24, 2013, now Pat. No. 9,240,539.

(60) Provisional application No. 61/638,675, filed on Apr. 26, 2012.

(51) Int. Cl.
*H01L 39/10* (2006.01)
*H01L 39/02* (2006.01)
*G01J 1/42* (2006.01)

(52) U.S. Cl.
CPC .............. *H01L 39/02* (2013.01); *G01J 1/42* (2013.01)

(58) Field of Classification Search
CPC ..... H01L 39/10; H01L 39/032; H01L 39/228; C04B 35/64; C04B 35/4504
See application file for complete search history.

(56) References Cited

U.S. PATENT DOCUMENTS

| | | | | |
|---|---|---|---|---|
| 5,532,485 A | * | 7/1996 | Bluzer | H01L 39/10 250/336.2 |
| 6,812,464 B1 | * | 11/2004 | Sobolewski | H01L 39/10 250/336.2 |
| 7,049,593 B2 | * | 5/2006 | Sobolewski | H01L 39/10 250/336.2 |
| 8,872,109 B2 | * | 10/2014 | Ohkubo | H01L 39/10 250/336.2 |

\* cited by examiner

*Primary Examiner* — Colleen Dunn
(74) *Attorney, Agent, or Firm* — Toby D. Hain (57) ABSTRACT

An apparatus includes a base layer; and a superconducting nanowire disposed on the base layer in a continuous meander pattern and including an amorphous metal-metalloid alloy such that the apparatus is configured to detect single photons, and the continuous meander pattern includes: a plurality of parallel line segments; and a plurality of curved segments, wherein adjacent parallel line segments are joined by a curved segment. A method for making an apparatus for detecting single photons includes forming a base layer; forming a superconducting layer on the base layer; patterning the superconducting layer; and forming a continuous meander pattern from the superconducting layer, the continuous meander pattern includes a plurality of parallel line segments; and a plurality of curved segments, wherein adjacent parallel line segments are joined by a curved segment; and forming a dielectric layer on the continuous meander pattern, the dielectric layer including a dielectric material that is substantially transparent to a predetermined photon wavelength, wherein the apparatus is configured to detect single photons.

20 Claims, 10 Drawing Sheets

EFFICIENT POLARIZATION INDEPENDENT SINGLE PHOTON DETECTOR

CROSS-REFERENCE TO RELATED APPLICATIONS

This application is a continuation of prior U.S. patent application Ser. No. 13/869,802, filed Apr. 24, 2013, which claims priority to U.S. Provisional Patent Application No. 61/638,675, filed Apr. 26, 2012, the disclosure of each of which is incorporated herein by reference in its entirety.

STATEMENT REGARDING FEDERALLY SPONSORED RESEARCH

This invention was made with United States government support from the National Institute of Standards and Technology. The government has certain rights in the invention.

BACKGROUND

Measurement of the timing and characteristics of photonic emissions is critical to many scientific applications. Photons are characterized by their wavelength, their polarization, and by their location in time and space.

A single photon detector (SPD) is a device that produces an electrical signal when a single photon is absorbed by the detector. SPD's include a single photon detector component that absorbs the photon and undergoes a change in state that produces the electrical signal. Recently single photon detector components have taken the form of solid state microelectronic circuits made using fabrication methods known in the art of solid state microelectronics. SPD devices also include optical components necessary to direct the light to the SPD microelectronic circuit and electrical components to amplify and process the electrical signals produced by the microelectronic circuit.

SPD's are widely used in scientific research in the fields of medicine, biology, astronomy, physics, chemistry, electrical and chemical engineering, material science, and aeronautics. Additionally, single-photon detectors are an essential tool for a wide range of applications in quantum information, quantum communications, and quantum optics.

The effectiveness of a photon detection device is measured in terms efficiency. Ideally, the detector should produce a signal every time a single photon enters the device. The probability that an electrical signal will be produced when a photon enters the SPD (expressed as a percent) is referred to as the system efficiency. The probability that a photon contacting the SPD microelectronic circuit will produce an electrical signal is known as the quantum efficiency of the microelectronic circuit. The wavelength, polarization, and the position of the light all affect the system efficiency of the SPD device, and quantum efficiency of the microelectronic circuit. The system efficiency can be no greater, and is frequently less, than the quantum efficiency of the microelectronic circuit.

Other characteristics of SPD's used to determine their suitability for certain applications are: signal-to-noise ratio, timing jitter, reset times, and dark count rate. Signal to noise ratio is the ratio of magnitude of the electrical signal produced from the device to the magnitude of electrical noise of the device. Timing jitter is the deviation of the measured photon arrival time from the actual photon arrival time. Reset time is the time it takes for the device to be reset to receive another photon after an initial photon is detected. Dark count rate is the number of (false) detection signals produced per unit time when no photons are entering the device. For SPD's to be useful in the widest possible applications they should have high signal-to-noise, low timing jitter, fast reset times, and low dark count rates.

There are numerous types of photon detector microelectronic circuits known in art. One type of SPD known in the art is an avalanche photodiode (APD). APD's are highly sensitive semiconductor electronic devices that exploit the photoelectric effect to convert light into electricity. An APD can be thought of as a photo-detector with a built-in first stage of gain through avalanche multiplication. From a functional standpoint, they can be regarded as the semiconductor analog to photomultipliers. Over the past decade, superconducting nanowire single photon detectors (SN-SPDs) have become promising alternatives to conventional semiconductor avalanche photodiodes in the near-infrared region of the spectrum. In particular, SN-SPDs based on niobium nitride (NbN) superconducting nanowires have demonstrated desirable properties 30 picoseconds timing jitter, fast reset times on the order of 10 nanoseconds, and low dark count rates below 1 kcps (thousand counts per second), but generally suffer from low system detection efficiencies of less than 20%. In addition, the efficiency of these detectors depends strongly on the polarization of the incident light.

Another problem known in the art is that the quantum efficiency of SN-SPD's degrades as the width of the nanowires increase, and therefore microelectronic circuits in the prior art have been limited to the use of extremely narrow nanowires. The quantum efficiency and sensing area of the microelectronic circuit are affected by the width of the nanowires and the width of channel spaces between the nanowires. NbN nanowires known in the art are arranged in a continuous meander pattern across the surface of the detector microelectronic circuit. In theory, larger geometric area covered by the nanowires should translate into a proportionately larger quantum efficiency of the microelectronic circuit. However, nanowires frequently have width dimensions of the order of the channels separating the nanowires from each other. Nanowires may have an approximate thickness of 5 nm and an approximate width of 100 nm. Current electron beam fabrication methods make it extremely difficult to create nanowires and channel features smaller than 100 nanometers. A limiting factor governing the quantum efficiency of SN-SPD microelectronic circuits based on NbN is that they have a relatively small area where absorption of photons may take place.

Another problem known in the art is that SPD devices experience decreased quantum efficiencies for photons having longer wave lengths. SPD devices currently known in the art, which utilize NbN, have achieved extremely high quantum efficiencies for photons whose wavelength is in the UV, visible, and for some wavelengths in the near infrared region of the spectrum.

Another problem known in the art is that the detection efficiency of SNSPD's depends upon the polarization of the light. There is an unmet need for superconducting SPDs that can detect photons with close to 100% efficiency for any photon wavelength, and any photon polarization. It is desirable to have SN-SPD technologies that provide larger areas for the absorption of photons within a designated physical area of the microelectronic circuit. It is desirable to have SN-SPD's with high signal-to-noise.

BRIEF DESCRIPTION

Disclosed is an apparatus comprising: a base layer; and a superconducting nanowire disposed on the base layer in a continuous meander pattern and comprising an amorphous metal-metalloid alloy such that the apparatus is configured to detect single photons, and the continuous meander pattern comprises: a plurality of parallel line segments; and a plurality of curved segments, wherein adjacent parallel line segments are joined by a curved segment.

Also disclosed is a method for making an apparatus for detecting single photons, the method comprising: forming a base layer; forming a superconducting layer on the base layer; patterning the superconducting layer; and forming a continuous meander pattern from the superconducting layer, the continuous meander pattern comprising: a plurality of parallel line segments; and a plurality of curved segments, wherein adjacent parallel line segments are joined by a curved segment; and forming a dielectric layer on the continuous meander pattern, the dielectric layer comprising a dielectric material that is substantially transparent to a predetermined photon wavelength, wherein the apparatus is configured to detect single photons.

BRIEF DESCRIPTION OF THE DRAWINGS

The patent or application file may contain at least one drawing executed in color. Copies of this patent or patent application publication with color drawing(s) will be provided by the Office upon request and payment of the necessary fee.

The following descriptions should not be considered limiting in any way. With reference to the accompanying drawings, like elements are numbered alike.

DETAILED DESCRIPTION

A detailed description of one or more embodiments is presented herein by way of exemplification and not limitation.

As used herein the term "nonmetallic material" refers to a material that is not metallic. The term "non-metallic materials" includes materials such as silicon known as metalloids.

As used herein the term "continuous meander pattern" refers to a microelectronic circuit characterized by a series parallel circuit lines joined by curved segments to form a continuous electrically continuous twisting and turning pattern made by a nanowire.

As used herein the term "patterned" refers to the attachment and definition of a layer of material in the form of a specified pattern on a base material.

As used herein the term "electrically connected" refers to components connected in such a way that electrons can flow between them.

As used herein the terms "orthogonal" or "orthogonally" refers to the relationship of two intersecting lines in a common plane or the relationship of two lines in different planes which would intersect each other if superimposed in a common plane. For example, orthogonally refers to the relationship of two meander patterns having segments which are perpendicular or substantially perpendicular to each other.

As used herein, the term "reactive surface" superconductive nanowire single photon detector microelectronic circuit means the combined surface of the continuous meander pattern of superconductive nanowires available to photons on the surface of the microelectronic circuit.

As used herein, the term "SNAP" means a superconducting nanowire avalanche photo-detector.

As used herein the term "tungsten-silicon alloy" or "tungsten silicide (TS)" means an amorphous material.

As used herein, the term "detection area" refers to the area on a photo detection microcircuit device which is capable of detecting photons.

References are made in the text to exemplary embodiments of a single photon detector with optimized reactive surface geometry only some of which are described herein. It should be understood that no limitations on the scope of the invention are intended by describing these exemplary embodiments. One of ordinary skill in the art will readily appreciate that alternate but functionally equivalent components may be used. The inclusion of additional elements may be deemed readily apparent and obvious to one of ordinary skill in the art. Specific elements disclosed herein are not to be interpreted as limiting, but rather as a basis for the claims and as a representative basis for teaching one of ordinary skill in the art to employ the present invention.

It should be understood that the drawings are not necessarily to scale; instead, emphasis has been placed upon illustrating the principles of the invention. In addition, in the embodiments depicted herein, like reference numerals in the various drawings refer to identical or near identical structural elements.

Moreover, the terms "substantially" or "approximately" as used herein may be applied to modify any quantitative representation that could permissibly vary without resulting in a change in the basic function to which it is related.

The present invention includes a three-dimensional single superconducting nanowire single photon detector (SN-SPD) microelectronic circuit that has higher quantum efficiency than of SN-SPD's known in the art. This is achieved because the unique material and configuration of the microelectronic circuit eliminates the polarization dependence and shows improved signal-to-noise over SN-SPD microelectronic circuits known in the art. This objective is achieved by vertically stacking two tungsten-silicide (TS)-SN-SPDs made of amorphous tungsten silicide (TS) and electrically connecting them in parallel. This structure forms a multilayer superconducting nanowire avalanche photo-detector (SNAP). A single photon detection device employing the multilayer (SNAP) microcircuit demonstrates a peak system detection efficiency of 87.7% and a polarization dependence of less than 2%. This represents nearly an order of magnitude improvement in both system detection efficiency and reduction of polarization dependence compared to conventional SNSPDs.

Figure 1:
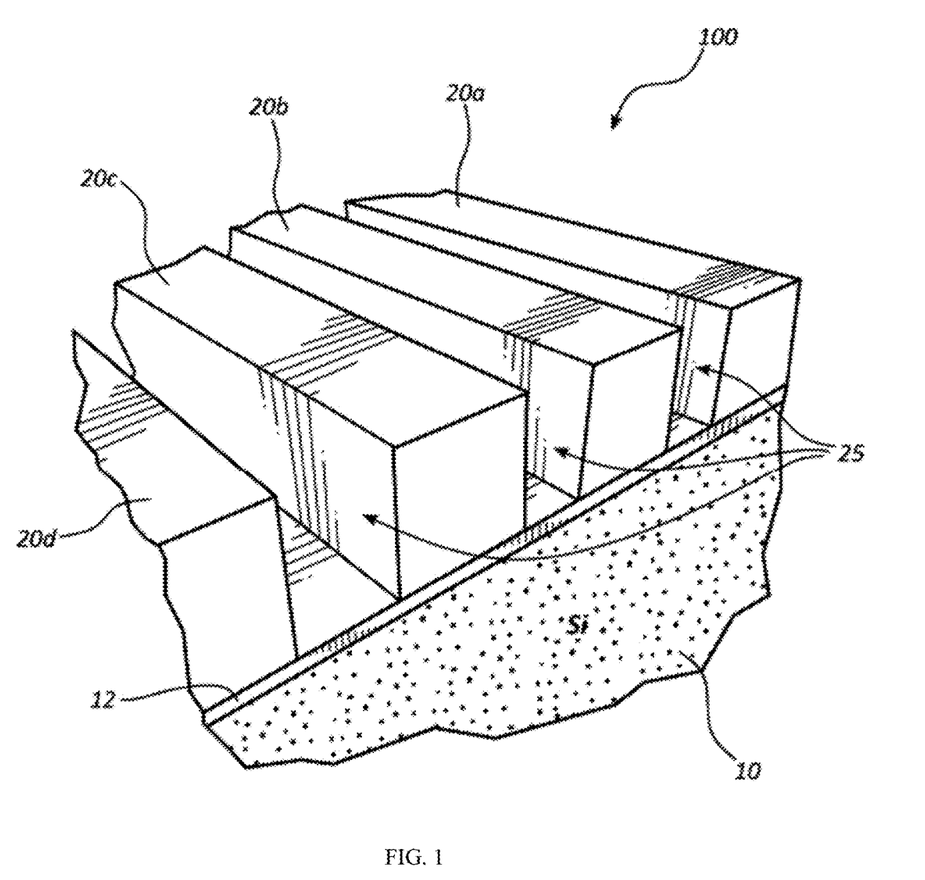
FIG. 1 is a cut-away perspective of an exemplary single layer superconductive nanowire meander pattern using a tungsten silicide (TS) nanowire.

FIG. 1 is a cut-away perspective of an exemplary single layer superconductive nanowire continuous meander pattern 100 using a tungsten silicide (TS) nanowire. FIG. 1 illustrates the prior art of a tungsten silicide (TS) nanowire sections 20a through 20n. The complete geometric pattern of the nanowire is referred to as a continuous meander pattern (shown in FIG. 2).

In FIG. 1, the front right portion of the microelectronic circuit is cut away to expose silicon substrate layer 10 and silicon oxide layer 12. Nanowire sections 20a through 20n are formed on an oxidized silicon substrate, which is a wafer of silicon on which a silicon oxide layer 12 has been created using a process known in the art. The illustrated embodiment was prepared by co-sputtering tungsten and silicon to a thickness of 4.5 nanometers. Then a poly(methylmethacrylate) resist was applied, and imaged using an electron beam. The areas revealed by the exposed resist are etched by reactive ion etching in sulfur hexafluoride. The area etched by reactive ion etching in the embodiment shown forms the etched channel spaces 25a through n, and the areas protected by the resist form the nanowire shown as nanowire sections 20a through 20n. In the embodiment shown the nanowires have a superconducting critical temperature of 3K, and an amorphous structure. In the exemplary embodiment, the tungsten silicide (TS) nanowire sections 20a through 20n are 150 nm wide and 4.5 nm thick. FIG. 1 illustrates etched channel spaces 25a through 25n which in the present embodiment is 100 nanometers wide.

In the embodiment shown, tungsten silicide (TS) nanowire sections 20a through 20n are comprised of 25 mole percent silicon, and 75 mole percent tungsten ($W_{0.75}Si_{0.25}$). The use of a tungsten silicide nanowire overcomes the manufacturing yield limitations of devices based on the conventional niobium nitride (NbN) superconductors because the amorphous tungsten silicide is less sensitive to defects than is the polycrystalline niobium nitride.

Figure 2:
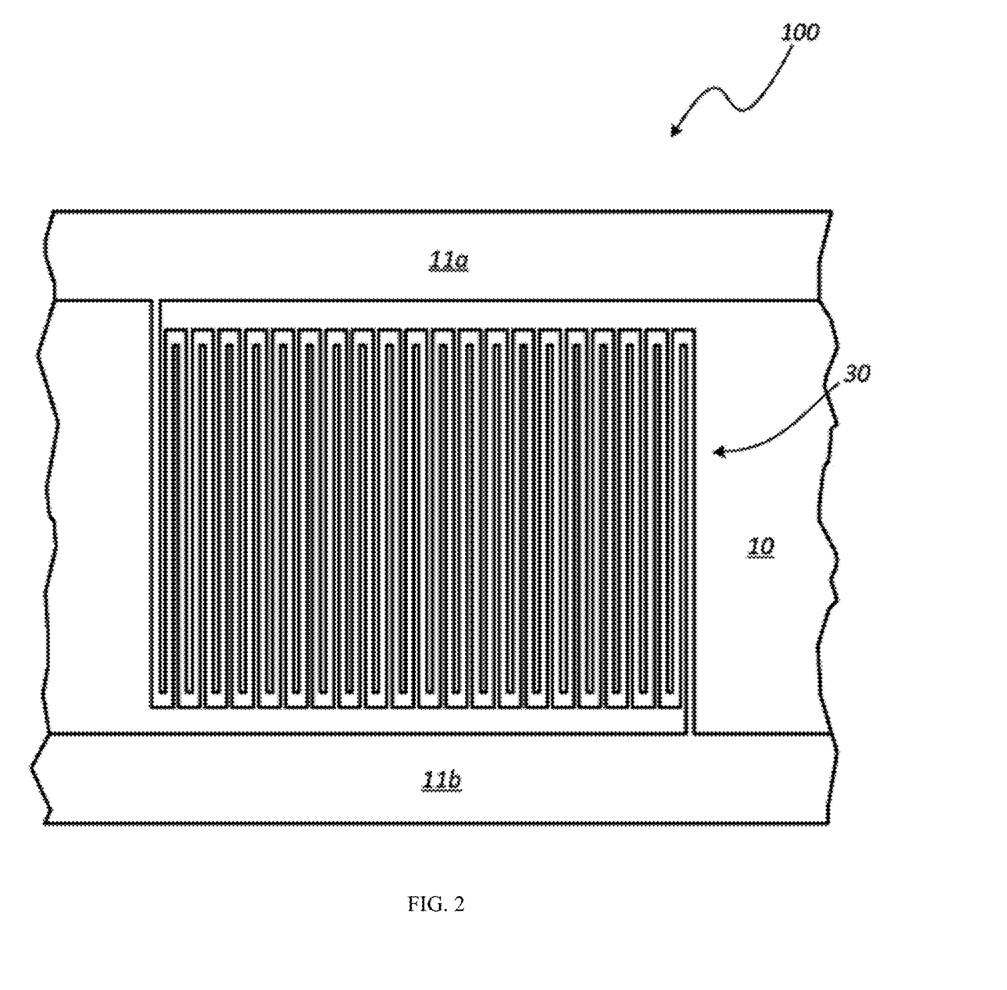
FIG. 2 is a top view of an exemplary single layer superconductive nanowire illustrating a meander pattern using a tungsten silicide (TS) nanowire.

FIG. 2 is a top perspective view of a superconductive nanowire detector microelectronic circuit 100 in the prior art illustrating the nanowire continuous meander pattern 30 and bonding pads 11a, and 11b. In the embodiment shown in FIG. 2 the nanowire continuous meander pattern 30 has an area of 16 µm×16 µm.

Nanowire 20 and bonding pads 11a, and 11b, are fabricated without significant constriction in the wires that would suppress the superconductive critical current ($I_c$). The silicon substrate 10 also can be seen at the base of the etched channel spaces 25. In the exemplary embodiment shown the etched channel spaces 25 are 100 nm wide, and lie between the TS nanowires 20a through 20n. The coverage area of the TS nanowires 20a through 20n in the embodiment shown represents 60% of the area of the continuous meander pattern 30. In the FIG. 2 illustrates a nanowire continuous meander pattern 30 which in this embodiment covers an area of 16 .mu.m.times.16 µm SN-SPD's based on an amorphous superconductor, tungsten silicide (TS), show that the use of this material enables the fabrication of detectors with significantly wider nanowire geometries (.about.150 nm) and higher detection efficiencies (>90%) than NbN-based SNSPDs.

FIG. 2 also illustrates bonding pads 11a, and 11b allowing the microscopic continuous meander pattern to electrically interface with electronic testing equipment known in the art.

In order to enable the tungsten silicide to operate as a super conductor for the detection of photons, certain requirements are necessary. The tungsten silicide nanowires must be cooled to a temperature below but near the superconductive critical temperature, and biased with a bias current less than the superconductive critical current. Tungsten silicide nanowires of the exemplary embodiment are superconductive at temperatures from 0 to 5K, dependent on the exact composition of the tungsten silicide alloy. At this temperature, the nanowire has no resistance to the flow of current. The absorption of a photon under these conditions is believed to create a "hot spot" in the TS nanowire 20.

Figure 3:
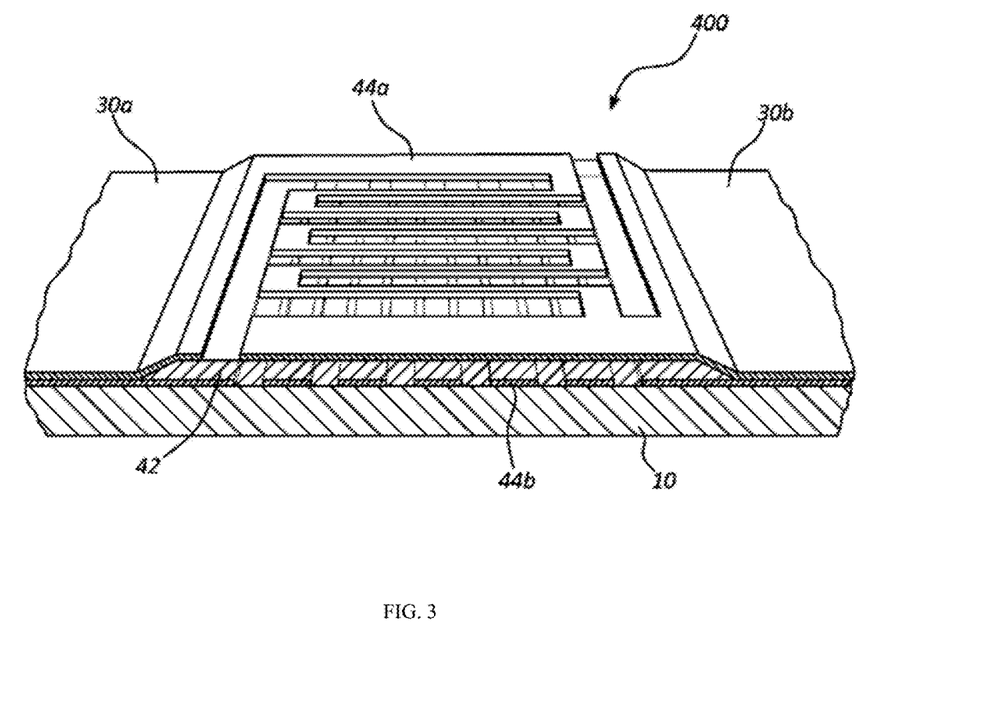
FIG. 3 is a side sectional perspective view of an exemplary embodiment of a multilayer polarization independent superconducting nanowire avalanche photo-detector (SNAP) microelectronic circuit.

FIG. 3 is a side sectional perspective view of an exemplary embodiment of a multilayer superconducting nanowire avalanche photo-detector (SNAP) microelectronic circuit 400. The exemplary embodiment showed in FIG. 3 illustrates a device architecture in which multiple nanowire continuous meander pattern sections are vertically stacked on top of each other. This architecture is referred as a multilayer SNAP. FIG. 3 illustrates a top continuous meander pattern 44a and a bottom continuous meander pattern 44b separated by a dielectric layer 42, and a silicon substrate 10. FIG. 3 also illustrates left bonding pad 30a, and right bonding pad 30b. The arrangement allows the top continuous meander pattern 44a, and the bottom continuous meander pattern to be electrically connected in parallel.

The multilayer superconducting nanowire avalanche photo-detector (SNAP) illustrated in FIG. 3 is a continuous nanowire meander pattern with N parallel sections, the bias current ($I_B$) must be increased beyond the avalanche threshold current $I_{AV}$ to ensure correct operation. Upon absorption of a photon one out of N sections switches to the normal state, diverting its current to the remaining N−1 sections and driving them into the normal state. Thus, an electrical current N times higher than the current of a single section is diverted to the load resistor, and the signal-to-noise ratio is improved by a factor of N. Nanowire detectors utilizing this parallel architecture with N sections have become known as cascade-switching super-conducting single-photon detectors or superconducting nanowire avalanche photo-detectors (N-SNAPs).

The exemplary embodiment illustrated in FIG. 3 shows vertically stacked the sections of SNAP's on top of each other. This architecture is referred to as a multilayer (SNAP). Furthermore, because the two sections could be patterned independently, the two sets of nanowires shown in FIG. 3 are oriented at orthogonal angles with respect to one another. The vertical stacking of orthogonal nanowire continuous meander patterns connected electrically in parallel has produced (1) a factor of .about.2 higher signal-to-noise ratio than previously reported with TS SNSPDs; (2) polarization independent system detection efficiency (SDE) over a ~100 nm-wide wavelength range; and (3) system detection efficiencies greater than 85%, comparable to the best results achieved to date with planar SNSPDs.

Each section of the multilayer SNAP consists of a 16 μm×16 μm nanowire continuous meander pattern with a nanowire width of 150 nm and a pitch of 350 nm. The thickness of each TS layer is 4.5 nm, yielding a superconducting critical temperature ($T_c$) of approximately 3 K, slightly lower than the bulk $T_c$ of 5 K for tungsten silicide alloy with an optimized Si composition of approximately 25%. These two nanowire meanders are separated by a 30 μm×30 μm, 75 nanometer thick square pad of hydrogen silsesquioxane (HSQ), a negative-tone pattern-able electron beam resist that becomes amorphous silicon oxide after exposure to an electron beam. The amorphous silicon oxide layer serves as a dielectric (electrical insulator) between the two SNSPDs. The top continuous meander pattern 44a and the bottom continuous meander pattern 44b are in contact with each other where the HSQ has been developed away on each side of the patterned silicon oxide square pad, so that the two sections are electrically connected in parallel.

While the deposition of a crystalline superconductor such as NbN directly on top of an amorphous material would be impossible without degradation of its superconducting properties, the amorphous nature of amorphous TS allows it to be deposited on silicon oxide without any degradation of the $T_c$ or the superconducting switching current ($I_{SW}$) of the top layer compared to the bottom layer. The quality of both layers was tested by characterizing the superconducting properties of single detectors both on top of and underneath the silicon dioxide dielectric layer.

Several layers not shown in FIG. 3 are added to increase the detection efficiency. The multilayer SNAP was embedded in a stack of dielectric materials to optimize absorption at a wavelength of 1550 nm. The stack is designed such that the antinode of the electric field was positioned halfway between the two TS detector layers, so that each detector layer absorbs an equal number of photons. The stack consists of an aluminum mirror and λ/4 layer of $SiO_2$ below the detector and four alternating layers of $SiO_2$ and silicon nitride above the detector. After the deposition of the top layers of the optical stack, a keyhole-shape was etched around the detector through the silicon substrate, and the resulting microelectronic circuit was removed, packaged, and aligned to a standard telecommunications single-mode optical fiber by use of a self-aligned packaging scheme. 20 This simplified packaging scheme ensures excellent alignment (63 lm) between the detector and the optical fiber.

Figure 4A:
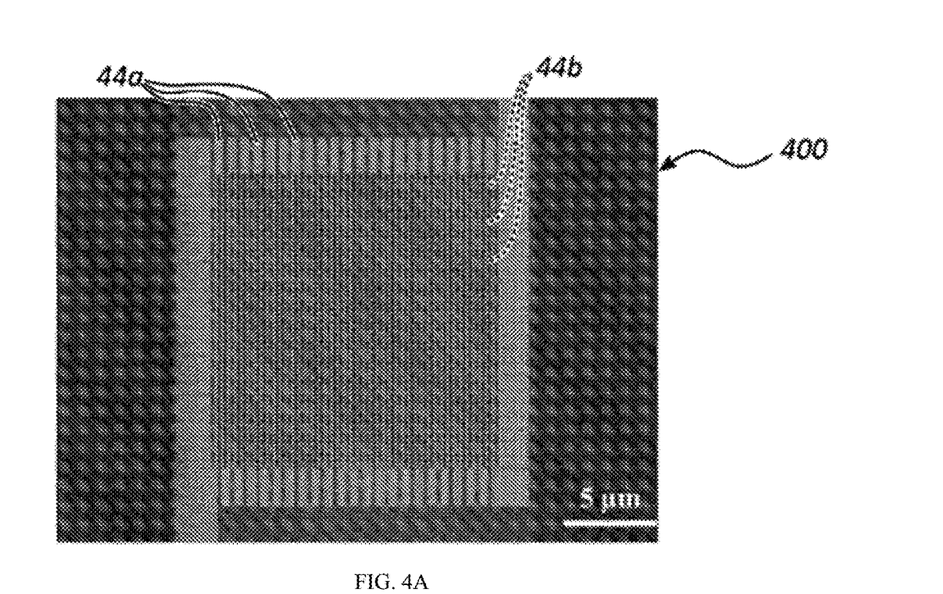
FIG. 4a is a scanning electron micrograph of an exemplary embodiment of a multilayer SNAP microelectronic circuit.

FIG. 4a is a scanning electron micrograph of an exemplary embodiment of a multilayer SNAP microelectronic circuit 400. FIG. 4 shows the top continuous meander pattern 44a as vertical lines and the bottom continuous meander pattern 44b as lighter horizontal lines. The bottom continuous meander pattern is lighter because it is partially obscured by dielectric layer 42. FIG. 4a also shows left bonding pad 30a, and right bonding pad 30b.

Figure 4B:
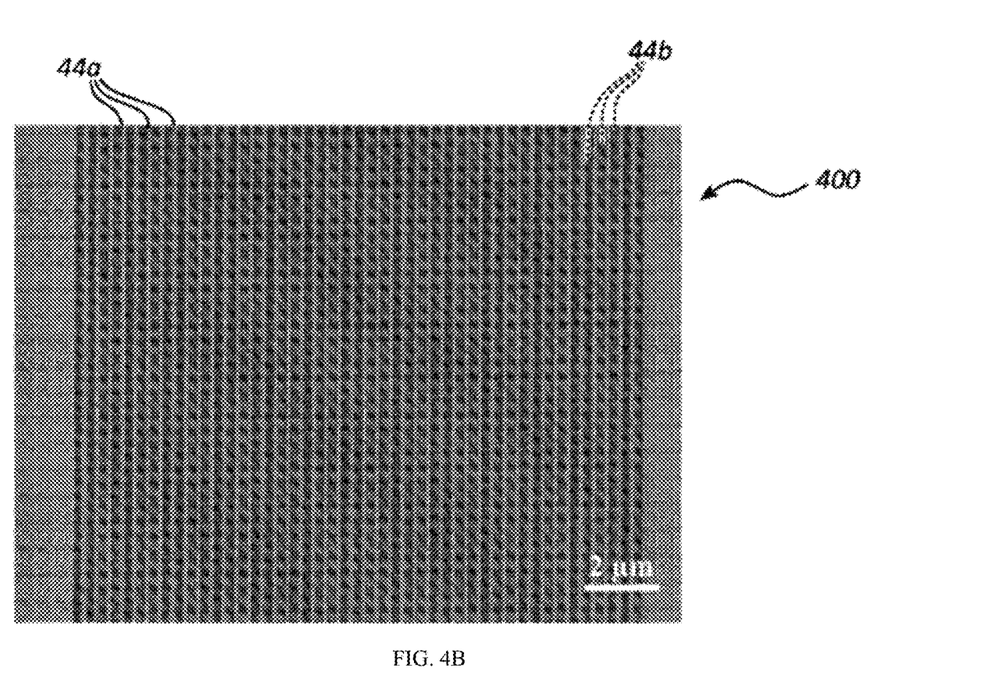
FIG. 4b is a close-up scanning electron micrograph of an exemplary embodiment of a multilayer SNAP microelectronic circuit.

FIG. 4b is a higher magnification scanning electron micrograph of an exemplary embodiment of a multilayer SNAP microelectronic circuit 400. FIG. 4 shows the top continuous meander pattern 44a as vertical lines and the bottom meander pattern 44b as lighter horizontal lines. The bottom continuous meander pattern is lighter because it is partially obscured by dielectric layer 42.

Figure 5:
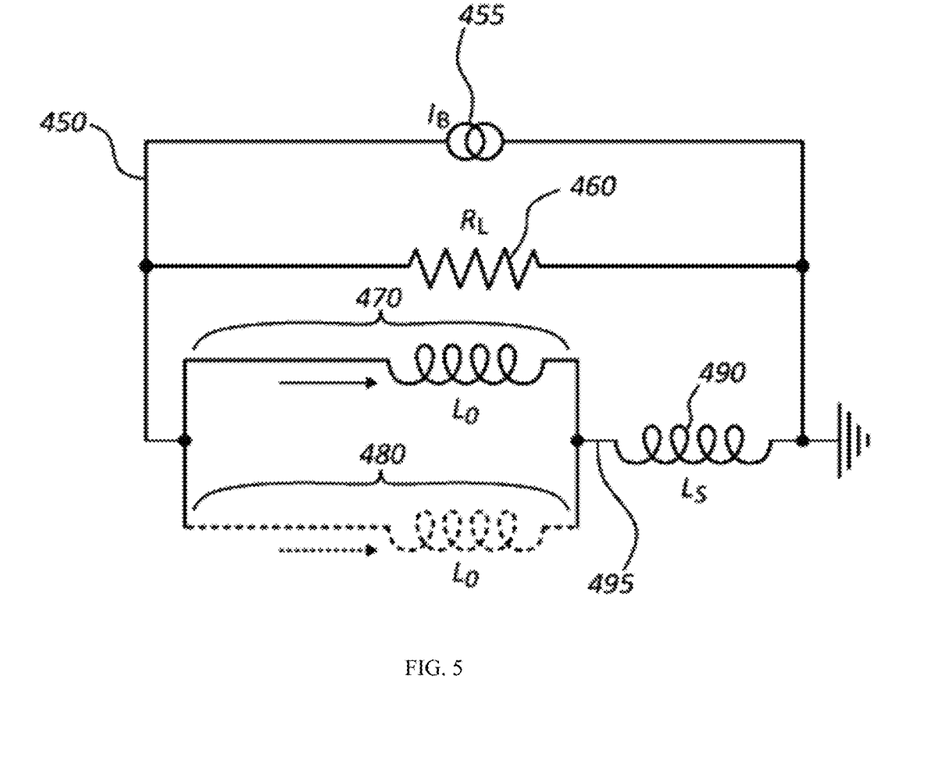
FIG. 5 is a wiring diagram of how an exemplary embodiment of a multilayer SNAP microelectronic circuit is wired.

FIG. 5 is a wiring diagram of how an exemplary embodiment of a multilayer SNAP microelectronic circuit is wired.

FIG. 5 illustrates a power supply 450, a bias current 455, a resistor 460, top continuous meander pattern inductor element 470, bottom continuous meander pattern inductor element 480, and large inductor 490. Large inductor 490 is electrically connected in series with top continuous meander pattern inductor element 470, and bottom continuous meander pattern inductor element 480. The large inductor 490 is fabricated on-microelectronic circuit in the top layer of tungsten silicide away from the detector area and is not illustrated in FIG. 3.

Figure 6A:
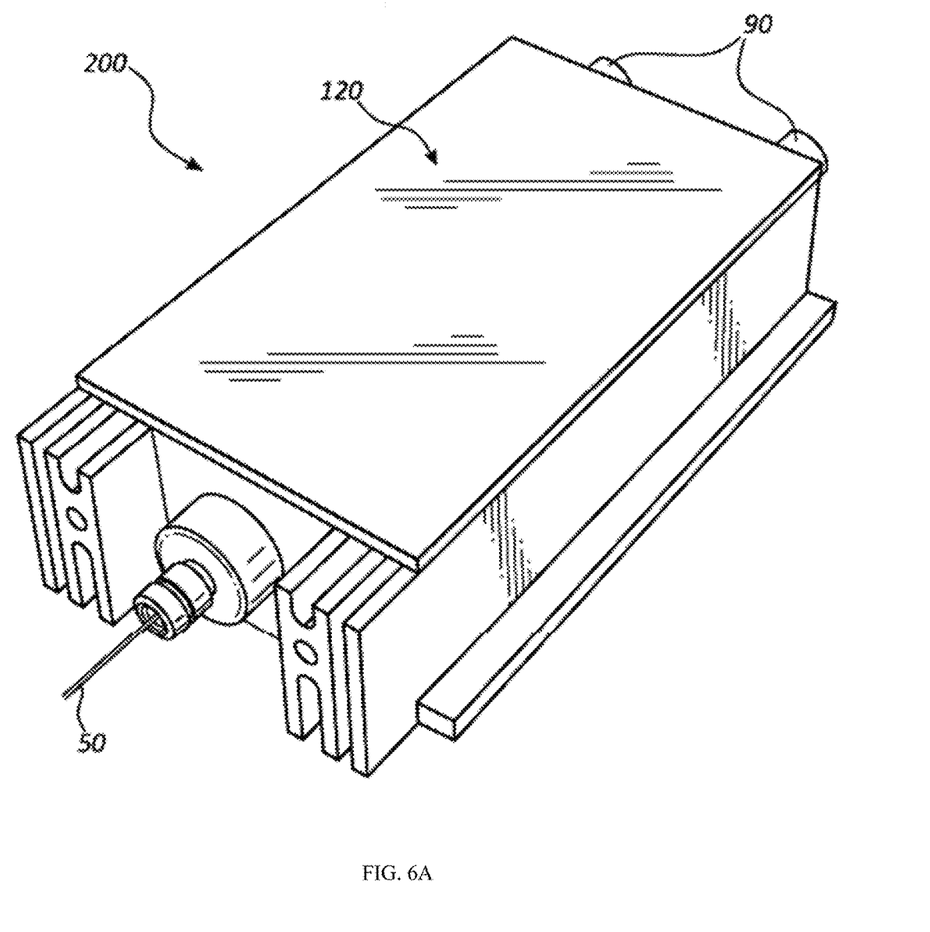
FIG. 6a is a top perspective view of an exemplary embodiment of a multilayer SNAP device.

FIG. 6a is a top perspective view of an exemplary embodiment of a multilayer SNAP device 200. FIG. 6a shows optical fiber 50, coaxial connectors 90, and thermal housing 120. In the exemplary embodiment shown the detector is mounted inside an adiabatic demagnetization refrigerator and cooled to ~150 milliK for measurements of the SDE (defined as the probability of detecting a photon that has been coupled into the fiber) and dark count rate (DCR).

Figure 6B:
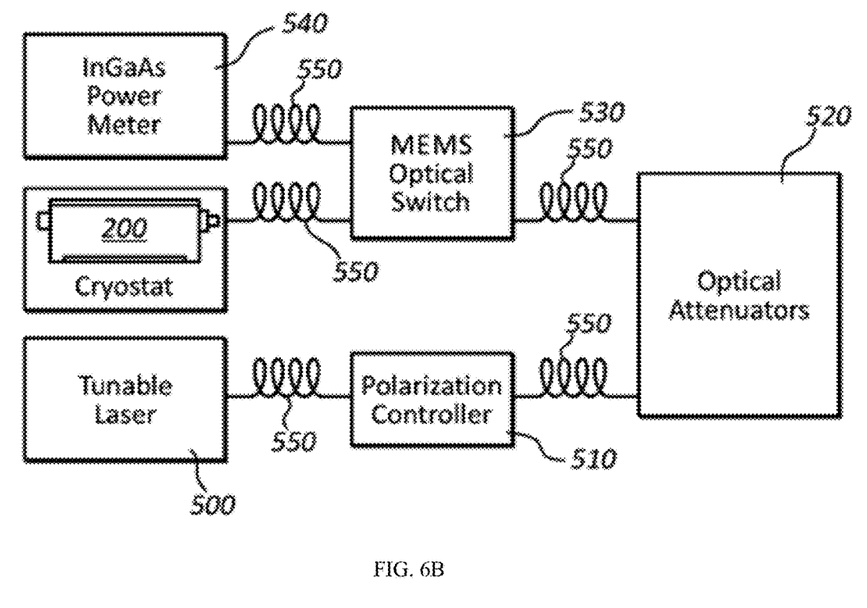
FIG. 6b is a diagram of the optical components of an exemplary embodiment of a multilayer SNAP test system.

FIG. 6b is a diagram of the optical components of an exemplary embodiment of a multilayer SNAP test system. FIG. 6b shows an exemplary embodiment of a multilayer SNAP test device 200. FIG. 6b shows tunable laser 500 which in the exemplary embodiment illustrated is a 1 mW laser tunable from (1520 nm to 1630 nm) through a computer controlled polarization controller. FIG. 6b illustrates optical attenuators 520, set to provide a count rate of approximately 50,000 photons/sec. FIG. 6b shows micro electro-mechanical system (MEMS) optical switch 530 used to switch between a power meter and the device under test. Before each measurement, the MEMS switch output was sent to the power meter for calibration of the number of photons per second incident on the detector, then switched to the device under test for measurement of the SDE.

Figure 7A:
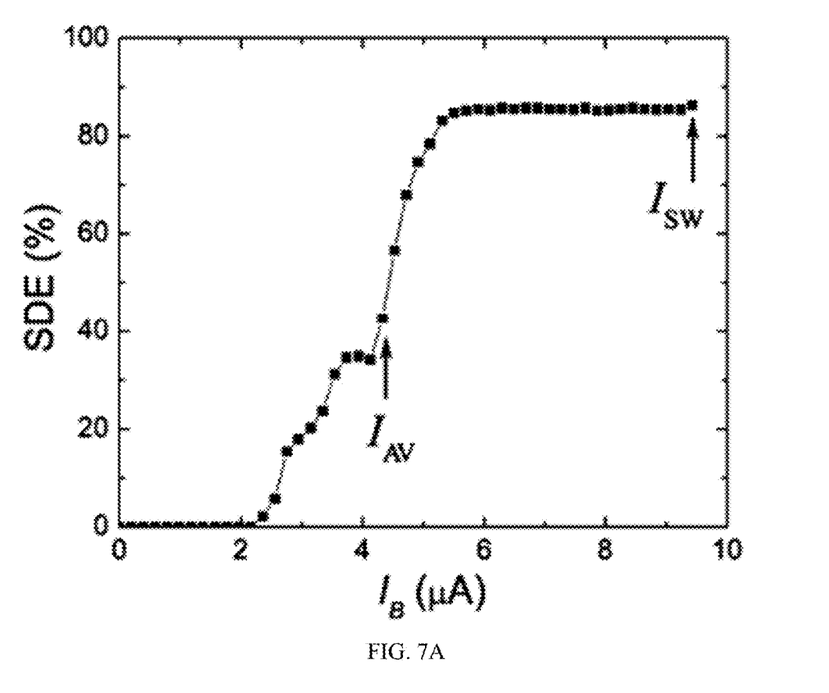
FIG. 7a is a plot showing the system detection efficiency (SDE) of an exemplary embodiment of a multilayer SNAP device as a function of bias current.

FIG. 7a is a plot showing the system detection efficiency (SDE) of an exemplary embodiment of a multilayer SNAP device as a function of bias current. In the exemplary embodiment shown in FIG. 7a light of 1550 nanometers is used. An SDE of 85.7%+/−0.6% is measured for the exemplary embodiment shown.

Figure 7B:
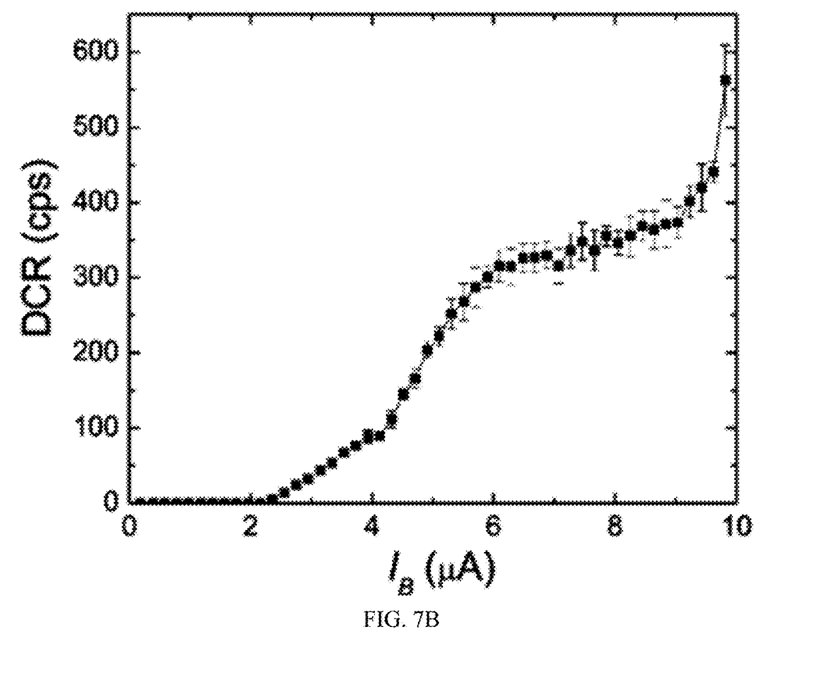
FIG. 7b is a plot showing the dark count rate (OCR) of an exemplary embodiment of a multilayer SNAP device as a function of bias current.

FIG. 7b is a plot showing the dark count rate (DCR) of an exemplary embodiment of a multilayer SNAP device. Conditions used for the measurements shown in FIG. 7b are the same as those for the measurements shown in FIG. 7a. For the exemplary embodiment shown the DCR is lower than 400 cps with a fiber coupled to the detector, which we attribute to stray blackbody radiation coupled into the fiber. Without a fiber coupled to the detector, the device exhibits a DCR of less than 0.1 cps. For the two detectors connected in parallel the switching current of 9.8 microamperes is approximately twice the switching current of a typical single-layer SN-SPD. From the bias dependence of the SDE, we find an avalanche current $I_{AV} \sim 0.6 \times I_{SW}$. The device exhibits a broad plateau in SDE over 40% of the bias range between the avalanche current and the switching current.

Although the larger signal-to-noise ratio is a benefit of the SNAP architecture, stacking the two sections of the multilayer SNAP at orthogonal angles eliminates the polarization dependence of the SDE in the exemplary embodiment.

Figure 8A:
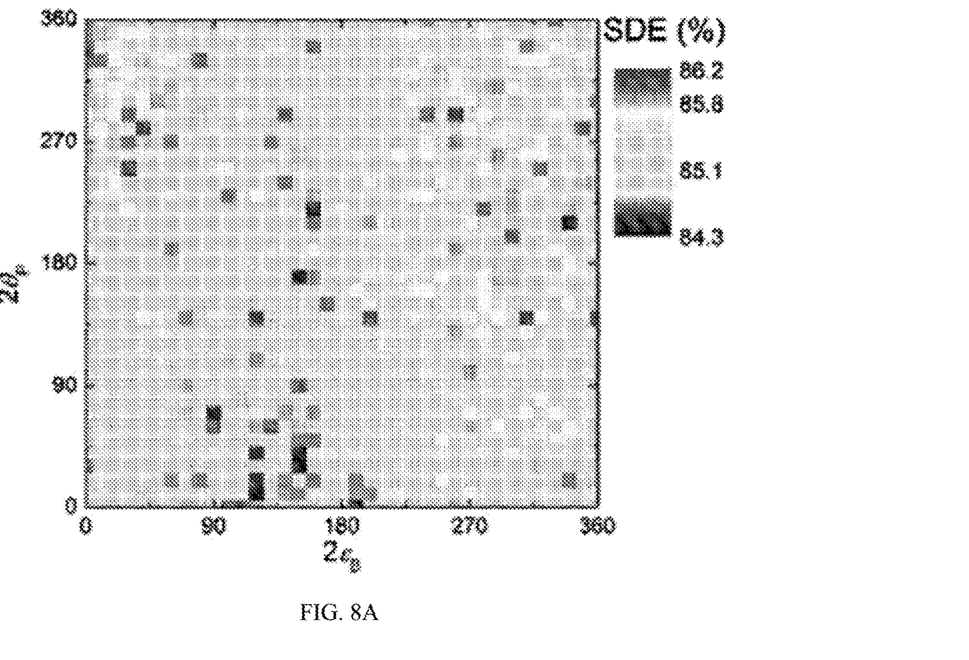
FIG. 8a is a map of the single-photon detection efficiency (SDE) over the Poincare sphere of an exemplary embodiment of a multilayer SNAP device.

FIG. 8a is a map of the single-photon detection efficiency (SDE) over the Poincare sphere of an exemplary embodiment of a multilayer SNAP device. The SDE values at 1560 nm are shown in a color scale and indicate the variation in efficiency over the whole range of possible polarizations. In FIG. 8a the horizontal and vertical axes represent the axial ratio (AR) where AR=(major axis)/(minor axis), $\in$=cot (AR), and the tilt angle (θ) of the polarization ellipse of the electric field vector of the photon. Using this notation, the quantities $2\in$ and $2\theta$ represent latitude and longitude on the Poincare sphere. The entire Poincare sphere is mapped by $-90°<2\in<90°$ and $0°<2\theta<360°$.

Figure 8B:
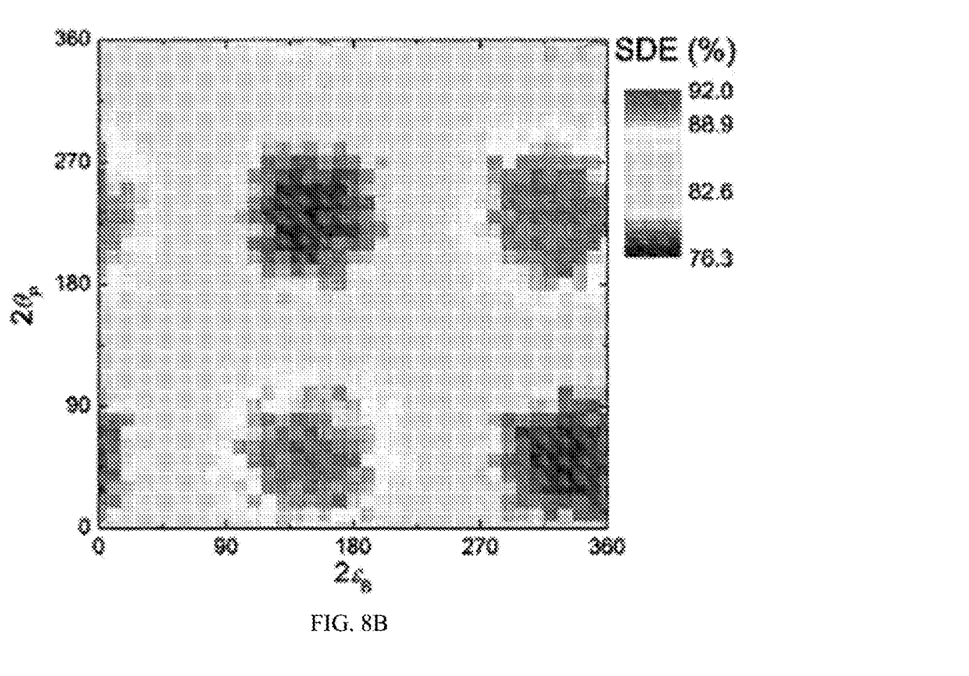
FIG. 8b is a map of the single-photon detection efficiency (SDE) over the Poincare sphere of a standard superconducting nanowire single photon detector (SN-SPD) device.

FIG. 8b is a map of the single-photon detection efficiency (SDE) over the Poincare sphere of a standard superconducting nanowire single photon detector (SN-SPD) device. The standard single-layer SNSPD exemplifying the prior art is a single-layer SNSPD had a wire width of 120 nanometers and a pitch of 220 nanometers. The device was embedded in an optical stack consisting of (bottom to top) a gold mirror, a layer of sputtered SiO.sub.2, the tungsten silicide detector, a second layer of SiO.sub.2, and a sputtered layer of TiO.sub.2, with layer thicknesses optimized for absorption at 1550 nm. Note the difference in scales.

Comparing FIG. 8a of multilayer SNAP device and FIG. 8a of the SN-SPD device the multilayer SNAP device shows a variation of less than 2%, over the Poincare sphere compared to the single-layer device, which shows a variation of approximately 16%.

Figure 9A:
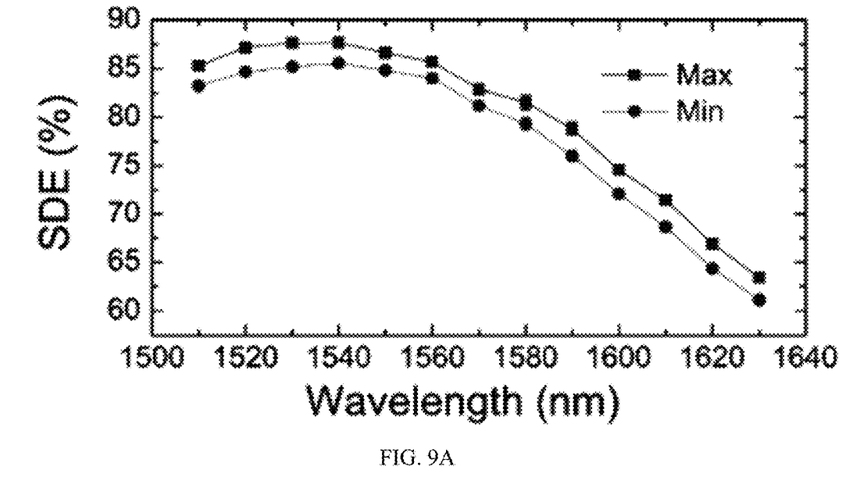
FIG. 9a is a plot of the maximum and minimum SDE over the Poincare sphere of an exemplary embodiment of a multilayer SNAP device.

FIG. 9a is a plot of the maximum and minimum SDE over the Poincare sphere of an exemplary embodiment of a multilayer SNAP device. The SDE reaches a peak of 87.7%+/−0.5% at 1540 nm, close to the design wavelength of 1550 nm. At shorter and longer wavelengths, the SDE decreases due to the effects of the optical stack.

Figure 9B:
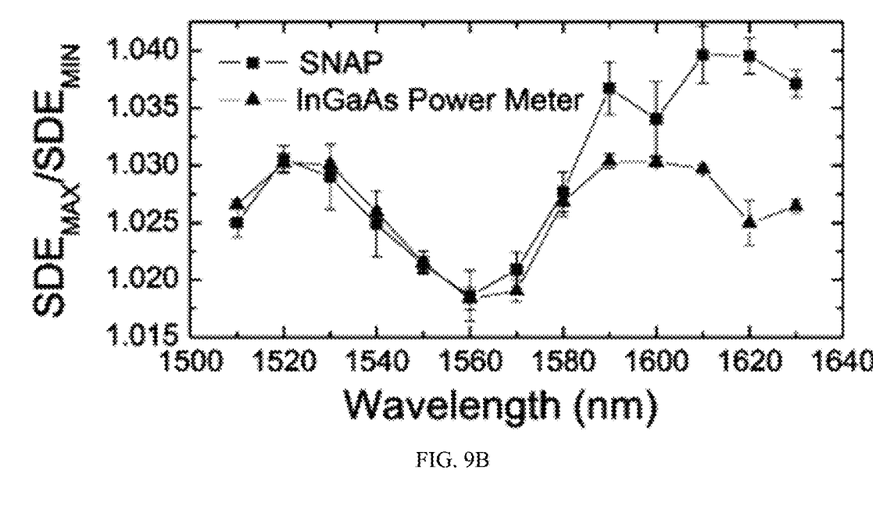
FIG. 9b is a plot of the ratio of the maximum to minimum SDE ($SDE_{max}/SDE_{min}$) as a function of wavelength for a InGaAs power meter and for an exemplary embodiment of a multilayer SNAP device.

FIG. 9b is a plot of the ratio of the maximum to minimum SDE ($SDE_{max}/SDE_{min}$) as a function of wavelength for an Indium-Gallium-Arsenide (InGaAs) power meter and for an exemplary embodiment of a multilayer SNAP device. The ratio $R_{DSE}=(SDE_{max}/SDE_{min})$ for the multilayer SNAP device (indicated by solid boxes) shows a minimum of 1.019 at 1560 nm and remains below 1.04 over the entire wavelength span from 1510 nm to 1630 nm. The fact that $R_{SDE}$ never reaches unity is attributed to the polarization dependence of the optical components of the measurement setup. To support this contention FIG. 9b also shows the wavelength dependence of the ratio between the maximum and minimum power measured by an InGaAs power meter while scanning the polarization over the Poincare sphere, indicated by the blue triangles in FIG. 9b. The similarity in the polarization dependence of the components of the measurement setup (shown in FIG. 6b) is indicated by the overlap of the triangles overlap with the squares within the error bars of the measurement over a wavelength range from 1520 nm to 1580 nm, indicating that the primary source of the small polarization dependence is the measurement setup and suggesting that the multilayer SNAP itself is polarization independent.

For applications requiring high repetition rates, the rise time, decay time, and dead time of the detector are important metrics. In the exemplary embodiment, a bias current of 9 microamperes an amplified voltage pulse height of 600 millivolts is measured with a rise time of 8 nanoseconds, a 1/e decay time of 57 nanoseconds, and a dead time (during which the system detection efficiency is suppressed) of 38 nanoseconds as estimated from inter-arrival time measurements. The long rise and decay times are due to the large series inductor (490 in FIG. 5) being ten times the inductance of continuous meander pattern inductors (470 and 480 in FIG. 5), required to ensure stable operation of the SNAP. As a result of the long rise time, we measure a relatively large jitter of .about.465 picoseconds.

Although the measured jitter is large relative to that of typical SNSPDs, it is significantly smaller than that of other single photon detectors such as transition edge sensors (TESs), and comparable to the jitter of commercially available Si APDs. The jitter of 465 picoseconds is compatible with the measurement of multi-photon entangled states produced at a repetition rate of 80 MHz by a Ti:Sapphire mode-locked laser. The multilayer SNAP would also provide for a smaller coincidence window than a TES in a loophole-free test of the Bell inequality allowing a smaller distance between detectors and improvement in the system detection efficiency in such a measurement. The jitter of the multilayer SNAP may be reduced by reducing the value of the large inductor 490 in FIG. 5, which can be done by reducing the inductance of each individual nanowire continuous meander patterns 470 and 480 in FIG. 5. This can be accomplished using a "nested" SNAP geometry, in which the top and bottom continuous meander patterns are themselves SNAPs.

The extension of the SNAP nanowire architecture into three-dimensions represents a significant advancement in single-photon detector technology. Improvements in optical stack design and fabrication and the use of a higher-fill-factor nanowire continuous meander pattern should allow for an SDE approaching 100%. The significant reduction of the polarization dependence of the SDE will enhance the overall detection efficiency in experiments where the light is un-polarized and will eliminate the need for polarization controllers and wave-plates in experiments where the light is strongly polarized. Finally, stacking more than two layers may provide a route to obtaining detection efficiencies approaching 100% that are less wavelength dependent, which may be important for applications requiring high detection efficiency over a broad range of wavelengths.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. An apparatus comprising:
    a base layer; and
    a superconducting nanowire disposed on the base layer in a continuous meander pattern and comprising an amorphous metal-metalloid alloy such that the apparatus is configured to detect single photons, and
    the continuous meander pattern comprises:
        a plurality of parallel line segments; and
        a plurality of curved segments, wherein adjacent parallel line segments are joined by a curved segment.

2. The apparatus of claim 1, further comprising a dielectric layer disposed on the superconducting nanowire and interposed between the base layer and the superconducting nanowire.

3. The apparatus of claim 2, wherein the amorphous metal-metalloid alloy comprises an alloy of tungsten and silicon.

4. The apparatus of claim 3, wherein the alloy of tungsten and silicon comprises 20 mole percent to 30 mole percent silicon.

5. The apparatus of claim 2, wherein the dielectric layer comprises an oxide of silicon and a nitride of silicon.

6. The apparatus of claim 1, wherein the dielectric layer comprises a transparent material that comprises an oxide, a nitride, and a fluoride.

7. The apparatus of claim 1, wherein the dielectric layer comprises a semiconductor that comprises silicon or germanium.

8. The apparatus of claim 1, wherein the apparatus is configured to detect single photons comprising a photon wavelength from 300 nanometers to 3,000 nanometers.

9. The apparatus of claim 8, wherein the photon wavelength is from 800 nanometers to 2,000 nanometers.

10. The apparatus of claim 9, wherein the photon wavelength is from 1050 nanometers to 1600 nanometers.

11. The apparatus of claim 8, wherein the photon wavelength is from 1800 nanometers to 2400 nanometers.

12. The apparatus of claim 1, wherein the apparatus is configured to detect single photons comprising a photon wavelength from 2000 nanometers to 8000 nanometers.

13. The apparatus of claim 1, further comprising an electrical inductor component electrically connected to the superconducting nanowire,
    wherein the electrical inductor component comprises an inductance that is greater than an inductance of the superconducting nanowire.

14. The apparatus of claim 13, wherein the inductance of the inductor component is at least 8 times the inductance of the superconducting nanowire.

15. The apparatus of claim 1, wherein the base layer is deposited on an alternating layer of silicon oxide and silicon nitride.

16. The apparatus of claim 15, wherein the alternating layer of silicon oxide and silicon nitride are deposited on a mirror layer that comprises a metal.

17. The apparatus of claim 1, wherein a width of the superconducting nanowire is from 3 nanometers to 3,000 nanometers.

18. The apparatus of claim 2, wherein a thickness of the dielectric layer is from 3 nanometers to 3,000 nanometers.

19. The apparatus of claim 1, further comprising a detection area that comprises the continuous meander pattern and that has a size that is greater than or equal to 125 square micrometers.

20. A method for making an apparatus for detecting single photons, the method comprising:
    forming a base layer;
    forming a superconducting layer on the base layer;
    patterning the superconducting layer; and
    forming a continuous meander pattern from the superconducting layer, the continuous meander pattern comprising:
        a plurality of parallel line segments; and
        a plurality of curved segments, wherein adjacent parallel line segments are joined by a curved segment; and
    forming a dielectric layer on the continuous meander pattern, the dielectric layer comprising a dielectric material that is substantially transparent to a predetermined photon wavelength,
    wherein the apparatus is configured to detect single photons.

* * * * *